United States Patent [19]

Bruder et al.

[11] Patent Number: 4,805,146
[45] Date of Patent: Feb. 14, 1989

[54] SOFT WRITE APPARATUS AND METHOD FOR NONDESTRUCTIVE READOUT CORE MEMORY

[75] Inventors: John F. Bruder, Phoenix; Sam L. Rainwater, Tempe, both of Ariz.

[73] Assignee: Quadri Corporation, Tempe, Ariz.

[21] Appl. No.: 856,507

[22] Filed: Apr. 28, 1986

[51] Int. Cl.⁴ .............................................. G11C 11/06
[52] U.S. Cl. ..................................... 365/131; 365/133
[58] Field of Search ................................. 365/131, 133

[56] References Cited

U.S. PATENT DOCUMENTS

| | | | |
|---|---|---|---|
| 2,876,442 | 2/1956 | Disson | 365/131 |
| 3,042,905 | 12/1956 | Kosonocky | 365/131 |
| 3,077,586 | 5/1959 | Ford, Jr. | 365/131 |
| 3,278,915 | 2/1963 | Joseph | 365/131 |
| 3,323,114 | 5/1967 | Gebhardt et al. | 365/131 |
| 3,375,504 | 3/1968 | Ihara | 365/131 |
| 3,466,631 | 9/1969 | Wang | 365/131 |
| 3,493,944 | 2/1970 | Kolk, Jr. | 365/131 |

OTHER PUBLICATIONS

1960 International Solid-State Circuits Conference Digest of Technical Papers; Feb. 11, 1960, pp. 58-59; 365-131.

Primary Examiner—James W. Moffitt
Attorney, Agent, or Firm—Cahill, Sutton & Thomas

[57] ABSTRACT

The sense voltages of an NDRO core memory including two cores per memory bit are increased by using a "soft write" technique wherein one of the two ferrite cores of each memory bit is written into by a smaller write current than the other. This results in a steeper slope toward the knee of the lower part of the hysteresis characteristic of the first core. The steeper slope results in a larger induced voltage for the first core. This increases the difference between the induced voltages of the two cores, thereby increasing the sense voltage to be detected by the sense circuitry.

18 Claims, 2 Drawing Sheets

SOFT WRITE APPARATUS AND METHOD FOR NONDESTRUCTIVE READOUT CORE MEMORY

BACKGROUND OF THE INVENTION

The invention relates to NDRO (nondestructive readout) core memories including at least two ferrite cores per memory bit, and more particularly to techniques for increasing the amplitudes of the sense voltages for each memory bit.

Most memory systems composed of ferrite cores have been DRO (destructive readout memories), wherein the read current forced through a core in order to induce a sense voltage on the sense-digit line destroys the stored state of that core. DRO core memories consequently usually include a restore cycle in which the sensed voltage is stored in a register and then rewritten back into the core. In certain applications wherein it is unacceptable to lose data in such a register, it is desirable to not be required to perform the restore cycle required by DRO memories. Thus, a market has developed for NDRO core memories, in which the read currents are small enough to avoid destroying the state of the memory bit being sensed. Unfortunately, use of smaller amplitude read currents results in reducing the amplitude of the sense voltages induced across the cores by the read currents. The sense voltages are already so small, typically 1 millivolt per core pair, that they are comparable to various kinds of electronic noise present within a large core array. (A plurality of "core pairs" can be used in each NDRO memory cell to boost the sense voltages, as is well-known by those skilled in the art.) The state-of-the-art for NDRO core memories is shown in U.S. Pat. Nos. 3,375,504 and 3,323,114. NDRO thin film magnetic memory systems have also been proposed, but have not proven as practical as NDRO core memories. The smaller sense voltages obtainable from NDRO core memories cause various problems in design of such memories, limiting memory speeds, maximum memory size, complexity and cost of sense circuits, etc. In some instances, it has been necessary to use four or six ferrite cores per memory bit in order to boost the sense voltages to adequate levels. This adds somewhat to the cost of memories of such NDRO core memories.

Despite the considerable demand for an improved NDRO core memory that provides larger sense voltages than has been heretofore achievable, those skilled in the art have been unable to appreciably improve the sense voltages of NDRO core memory systems.

SUMMARY OF THE INVENTION

Accordingly, it is an object of the invention to provide a method and apparatus for increasing the sense voltages of multiple-core per bit NDRO core memories.

It is another object of the invention to provide a larger, faster, more reliable NDRO core memory than, as a practical matter, has been previously achievable.

Briefly described, and in accordance with one embodiment thereof, the invention provides an NDRO core memory having a plurality of memory bits each including first and second ferrite cores, and a technique for increasing the sense voltages produced thereby during read operations. A word line driver circuit provides positive or negative word currents, i.e., select currents, passing through each of the two cores of all the memory bits in a word. A sense amplifier and digit driver circuit is connected to a sense-digit line and can produce therein positive and/or negative digit currents. The sense-digit line is strung through the two cores of each memory bit or cell so as to cause a particular digit current to pass in one direction through the first core with reference to the word current in that bit and in the opposite direction through the second core with reference to the word current of that memory bit. In a write "1" cycle, a positive digit current is driven through the digit line, and a positive word line current is simultaneously driven through the word line to set the first core of a memory bit to a first state. Then, with the positive digit current still flowing in the digit line, a negative word line current of lower magnitude than the positive word line current is forced through the word line to set the second core of that bit to an appropriate second state, such that the second core has a predetermined hysteresis loop that is substantially smaller than that of the first core. The smaller hysteresis loop has a steeper bottom edge slope toward the knee than the larger hysteresis loop has toward saturation. When a positive read current pulse is forced through the word line, the second core, which has the smaller hysteresis loop, is "dominant", and a larger voltage is induced across it by the edges of the read current pulse than for the first core. The difference between the voltages induced across the first and second cores is applied to input of the sense amplifier, and is substantially larger than would be the case if the second core were written with a negative word current of the same amplitude as the positive word current. This technique is referred to as a "soft write" technique.

DESCRIPTION OF THE INVENTION

Figure 1:
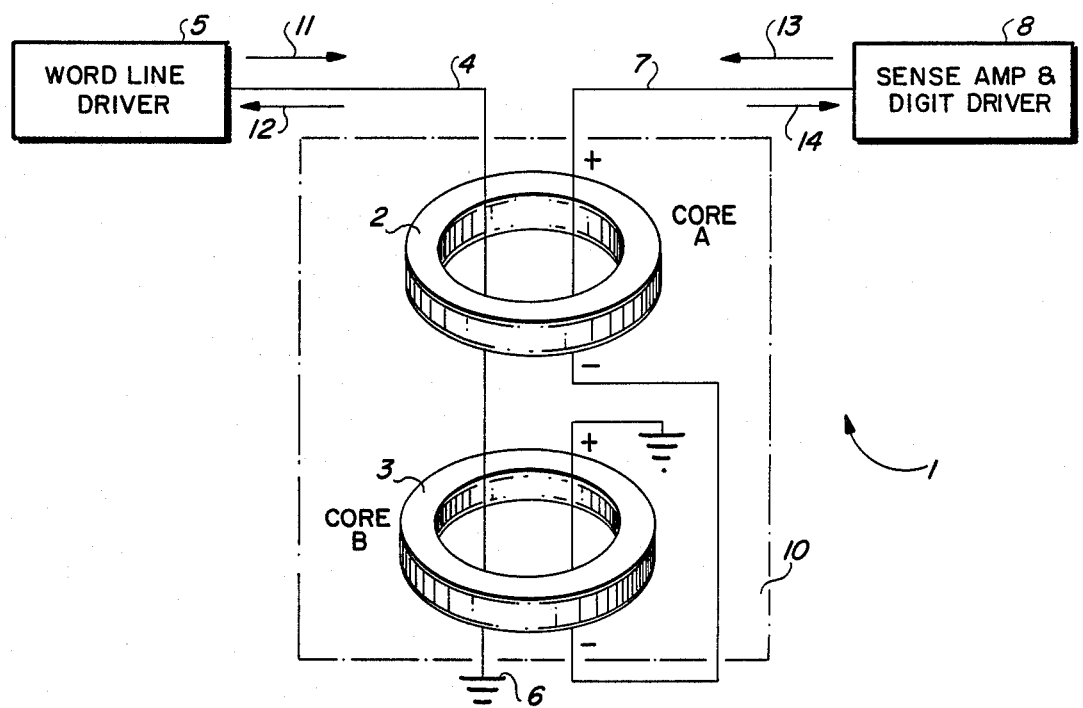
FIG. 1 is a schematic circuit diagram illustrating an NDRO memory bit and associated word line driver and sense amplifier and digit driver circuitry.

Referring now to FIG. 1, NDRO core memory 1 includes a plurality of NDRO memory bits, including memory bit 10, each of which includes at least two cores 2 and 3, hereinafter referred to as core A and core B, respectively. A word line conductor 4 connected to an output terminal of a word line driver circuit 5 extends downward through the openings in cores A and B, respectively, and, after passing through the corresponding cores of a number of additional, essentially identical NDRO memory bits (not shown), is connected to a ground conductor 6.

A sense-digit line 7, which is connected to the output of a digit driver circuit and to the input of a high gain sense amplifier in block 8, also is strung through cores A and B in the fashion shown in FIG. 1. More specifically, sense-digit conductor 7 is looped around core B and then strung through it in the opposite direction to core A, and then continues in similar fashion 2 to pass through the cores of the others of above-mentioned additional NDRO bits before being connected to ground 4 conductor 6.

Those skilled in the art will understand that an actual NDRO core memory system would include a number of additional word line driver circuits, word lines, sense amplifiers, digit driver circuits, and sense-digit lines similar to those shown in FIG. 1.

The above-described NDRO core memory structure is known to those skilled in the art, and is similar to the one disclosed in the above-mentioned U.S. Pat. No. 3,375,504. However, the subsequently described "soft write" technique for increasing the sense voltages induced in the NDRO memory bits such as 10 is not known.

Before describing the "soft write" technique of the present invention, it should be noted that word line driver circuit 5 can produce positive word line currents in the direction of arrow 11 in FIG. 1, or negative word line currents in the direction of arrow 12. Similarly, the digit driver in block 8 can produce positive digit currents in the direction of arrow 13 or negative digit currents in the direction of arrow 14. A wide variety of suitable word line driver circuits capable of producing such positive and negative word line currents can be readily provided by those skilled in the art. Detailed circuitry for implementing word line drivers 5 therefore is not included. Similarly, those skilled in the art have implemented a wide variety of publicly known sense amplifiers and digit driver circuits for DRO and NDRO core memories, so there is no need to disclose specific circuitry for block 8.

Those skilled in the art will recognize readily that the basic operation of the NDRO memory bit 10 shown in FIG. 1 is that core A and core B are always written to opposite states during any write cycle. Since coincidence of a word line current and a digit line current flowing in the same direction through the aperture of either of core A or core B is needed to set that core to either one of its two stable states, each memory write operation involves establishing either a positive or a negative digit current in sense-digit line 7, depending upon whether it is desired to write a logical "1" or a logical "0" into memory bit 10.

With the direction of the digit current in the sense-digit line 7 selected, a positive word line current is produced in word line 4 to set the state of one of cores A and B, and then the direction of the word line current is reversed, providing a negative word line current, to set the opposite state in the other of cores A and B. One of the two cores will have a stable state at the midpoint of the upper edge of its hysteresis loop, and the other will have a stable state centered on the bottom edge of its hysteresis loop.

The slopes of the top and bottom lines of the hysteresis loops are slightly different, so when a read current is forced through word line 4 in the direction of arrow 11 by word line driver circuit 5, there will be a slight difference in the voltages induced in core A and core B. Due to the way that the sense-digit line 7 is strung in opposite directions through core A and core B, the difference between these two induced voltages will appear on conductor 7 at the input of the sense amplifier in block 8. Readout of the memory bit 10 thereby is achieved without disturbing either core A or core B, because the read current produced by word line driver 5 has the same amplitude as the positive and negative word line currents, (which without coincidence of an equal amplitude digit current, are insufficient to change the state of either of cores A and B).

Figure 2:
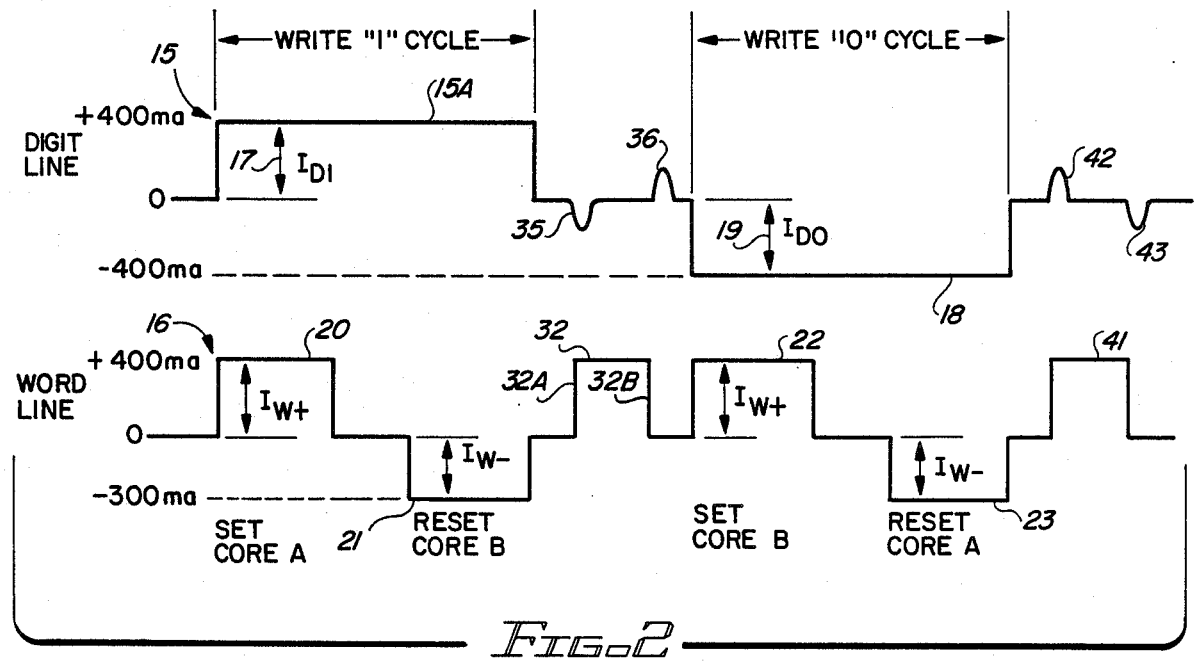
FIG. 2 is a timing diagram illustrating the soft write technique for operating the NDRO memory of FIG. 1 in such a manner as to increase the sense voltages.

The above-described sequence of operations is implemented by the "word line" waveform 16 and the "digit line" waveform 15 in FIG. 2. Pulse 15A of the digit line waveform 15 represents the positive digit line current mentioned above. It may have an amplitude $I_{D1}$ as indicated by arrow 17, during a write "1" cycle. Digit line waveform 15 includes a negative digit current pulse 18 having an amplitude $I_{D0}$, as indicated by arrow 19 during a write "0" cycle.

Figure 3A:
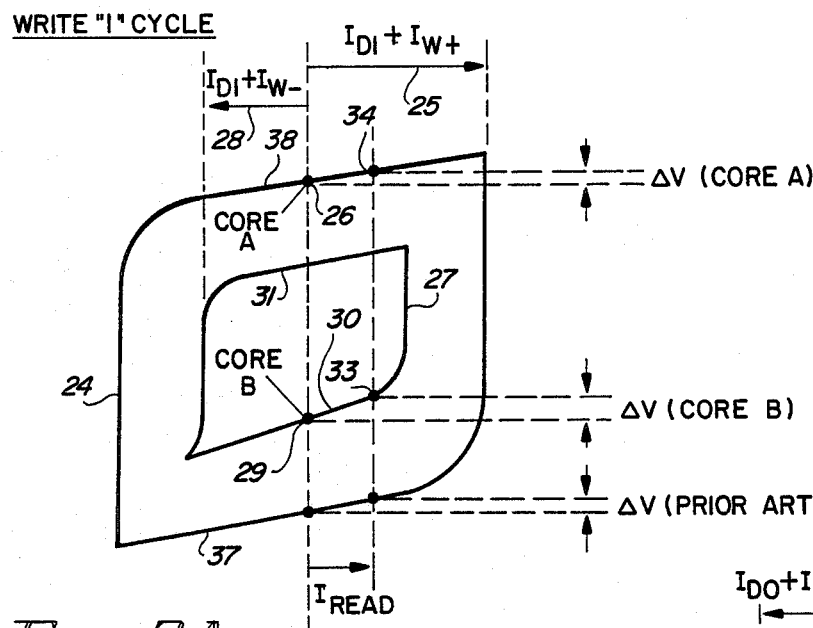
FIG. 3A is a diagram showing a pair of hysteresis loops of the two cores shown in FIG. 1 during the write "1" cycle indicated in the timing diagram of FIG. 2.

By way of definition, "setting" of either core A or core B is defined to mean that current is set to a state such as the one designated by reference numeral 26 in FIG. 3A, i.e., is a "full current" write operation. Similarly, resetting of a core is taken to mean setting of it by a "soft current write" operation, wherein the smaller hysteresis loop shown in FIG. 3A occurs. The state of the "soft write" core is indicated by reference numeral 29 in FIG. 3A.

The word line current waveform 16 has a positive current pulse 20 with an amplitude $I_{W+}$ during the first portion of positive digit line current pulse 15A. This causes coincidence of current pulses of amplitudes $I_{D1}$ and $I_{W+}$ flowing in the directions of arrows 11 and 13 through core A, setting it; the same currents flow in opposite directions through core B, and have no effect on it. Later in the write "1" cycle, a negative word line current pulse 21 having amplitude $I_{W-}$ small than $I_{W+}$ flows through word line conductor 4 in the direction of arrow 12. Then, the two currents flow in opposite directions through core 3 A and have no effect on it, but flow in the same direction through core B, and reset it to the opposite state of core A.

Figure 3B:
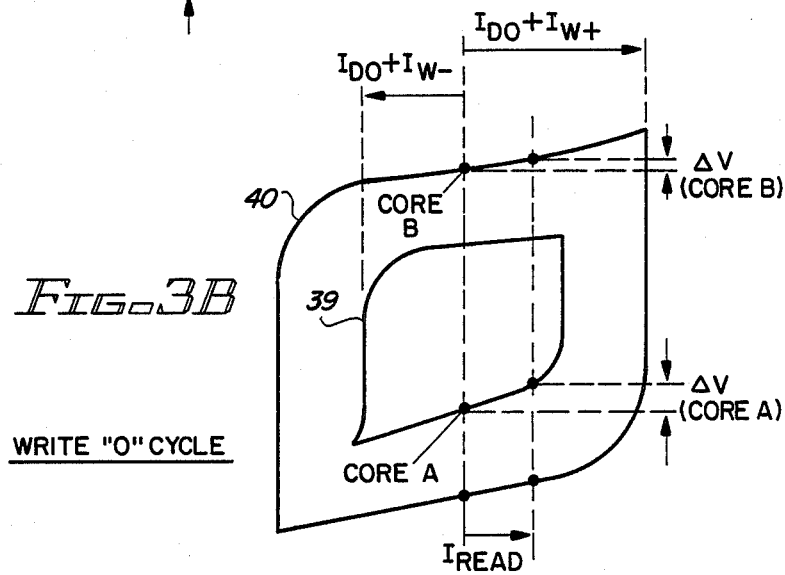
FIG. 3B is a diagram illustrating a pair of hysteresis loops of the two cores in the NDRO memory bit of FIG. 1 as a result of the write "0" cycle of FIG. 2.

Similarly, during the write "0" cycle, a coincidence of positive current pulse 22 and negative digit line current pulse 18 causes core B to be set, as indicated in FIG. 3B, and later in the write "0" cycle, the coincidence of negative word line current waveform pulse 23 and negative digit line current waveform 18 causes core A to be reset.

In accordance with the present invention, the "soft write" technique is accomplished by deliberately making the amplitude of the negative word line currents $I_{W-}$ substantially less than the amplitude $I_{W+}$ of the positive word line currents, so that a smaller hysteresis loop is provided in whichever of core A and core B is set or reset by the negative word line current $I_{W-}$. For reasons that subsequently will become apparent, the one of cores A and B which is "soft written" into is hereinafter referred to as the "dominant" core".

As indicated above, the hysteresis loops for core A and core B for the write "1" cycle of FIG. 2, are shown in FIG. 3A. Reference numeral 24 represents the hysteresis loop of core A. This hysteresis loop is caused by the sum of $I_{D1}$ and $I_{W+}$, as indicated by arrow 25. It produces the stable state in core A designated by reference numeral 26. Reference numeral 27 designates the smaller but "dominant" hysteresis loop of core B. This hysteresis loop 27 is caused by the coincidence of currents $I_{D1}$ plus $I_{W-}$, as indicated by arrow 28, and produces in core B the stable state designated by point 29 on the bottom edge of dominant hysteresis loop 27.

For convenience, the state of memory bit 1 will be defined to be the state of the dominant core, the one written with the negative word line amplitude $I_{W-}$. (The other core can be referred to as a "reference core".)

At this point, it is important to note that the slope of the lower edge 30 of dominant hysteresis loop 27 (FIG. 3A) is substantially steeper than the slope of its upper edge 31. Thus, when a positive read current $I_{READ}$, designated by reference numeral 32, is forced through word line 4, the stable state 29 of core B moves to the right to the point designated by reference numeral 33 in FIG. 3A. A voltage having the polarity of the plus (+) and minus (−) symbols associated with core B in FIG. 1 having an amplitude ΔV(CORE B) will be induced across core B. Similarly, the read current $I_{READ}$ of pulse 32 causes the stable point of core A to move from point 26 to point 34 along the upper edge of hysteresis loop 24, inducing a voltage ΔV(CORE A) having the polarity indicated by the plus (+) and minus (−) signs associated with core A in FIG. 1.

The difference between ΔV(CORE B) and ΔV(CORE A) is the signal that appears on sense-digit line 7 at the input of the high gain sense amplifier in block 8. Reference numeral 35 designates this differential voltage on the digit line waveform 15 in FIG. 2. Differential voltage 35 induced by the positive-going edge 32A of read pulse 32. An identical pulse of 36 of opposite polarity is induced on sense-digit line conductor 7 by the negative-going edge 32B of read pulse 32.

In accordance with the present invention, the amplitude of sense pulse 35 may be about 3 millivolts if the amplitudes of $I_{D1}$, $I_{W+}$ and $I_{READ}$ are 400 milliamperes and the amplitude of soft write current $I_{W-}$ is 300 milliamperes.

It should be noted that the substantial improvement in the amplitude of ΔV(CORE B) over ΔV(CORE A) in FIG. 3A is achieved only if the direction of the read current $I_{READ}$ is opposite to the direction of the "soft write" current $I_{D1}+I_{W-}$, because the slope of the bottom edge of dominant hysteresis loop 27 does not begin to increase at a substantially faster rate than the slope of the upper edge until the stable point of that core moves to the right of point 29 in FIG. 3A. A negative read current would move the stable points 29 and 26 to the left, and the difference in the induced voltages of the dominant core and the other core would be significantly less.

If the prior art technique of using approximately the same amplitudes for the positive and negative word line current amplitudes is used, then the read current $I_{READ}$ induces a voltage ΔV(PRIOR ART) across core B, which in accordance with the prior art has essentially the same hysteresis loop as core A, and the differential voltage applied to the input of the sense amp is the difference between ΔV(PRIOR ART) and ΔV(CORE A). The slope of the lower edge 37 of hysteresis loop 24 is much more nearly equal to the slope of the upper edge 38 thereof, and the difference of voltage applying on the sense-digit line 7 is much less than for the soft write technique of the present invention, and typically would be only about 1 millivolt per core pair.

The operation during the above-mentioned write "0" cycle shown in FIG. 2 is entirely analogous to that described for the write "1" cycle, except that core A is the dominant core instead of core B. The hysteresis loops 39 and 40 in FIG. 3B illustrate the stable states of cores A and B at the end of the write "0" cycle. The read current $I_{READ}$ shown in FIG. 3B is represented by read current pulse 41 in FIG. 2, and the 3 millivolt difference signals between ΔV(CORE B) and ΔV(CORE A) resulting from the positive and negative edges of read current pulse 41 are represented by reference numerals 42 and 43, respectively in FIG. 2.

Thus, sense voltage 35 in FIG. 2 represents the non destructive readout of a stored "1", and sense voltage 42 represents the non-destructive readout of a stored "0".

The "soft write ratio" is defined to be the ratio $I_{W-}$ divided by $I_{W+}$. Up to a certain point, decreasing the soft write ratio by reducing the amplitude of $I_{W-}$ has the result of increasing the difference between the slope of the bottom edge 30 of the dominant hysteresis loop such as 27 in FIG. 3A compared to the slope of the upper edge 38 of the hysteresis loop of the other core. Typically, when the soft write ratio is decreased to less than about 0.5, the dominant core will begin to "walk", or "partially switch".

The above-described soft write technique represents a substantial advance in the state of the art for NDRO core memories and makes it feasible to provide larger, more reliable NDRO core memories with greater noise immunity while using less expensive sense amplifier circuitry than has been the case for prior NDRO core memories.

It should be noted that the above described soft write operation can be accomplished using waveforms other than those shown in FIG. 2. For example, a soft write can be obtained by using equal values for $I_{W+}$ and $I_{W-}$, and using either an appropriately sloped digit current or an appropriately stepped digit current having a smaller amplitude portion to "set" the state of one or the other of the two cores A and B during read "1" and read "0" memory cycles, and thereby achieve the above-described increasing of the amplitude of the sense voltage.

Figure 4:
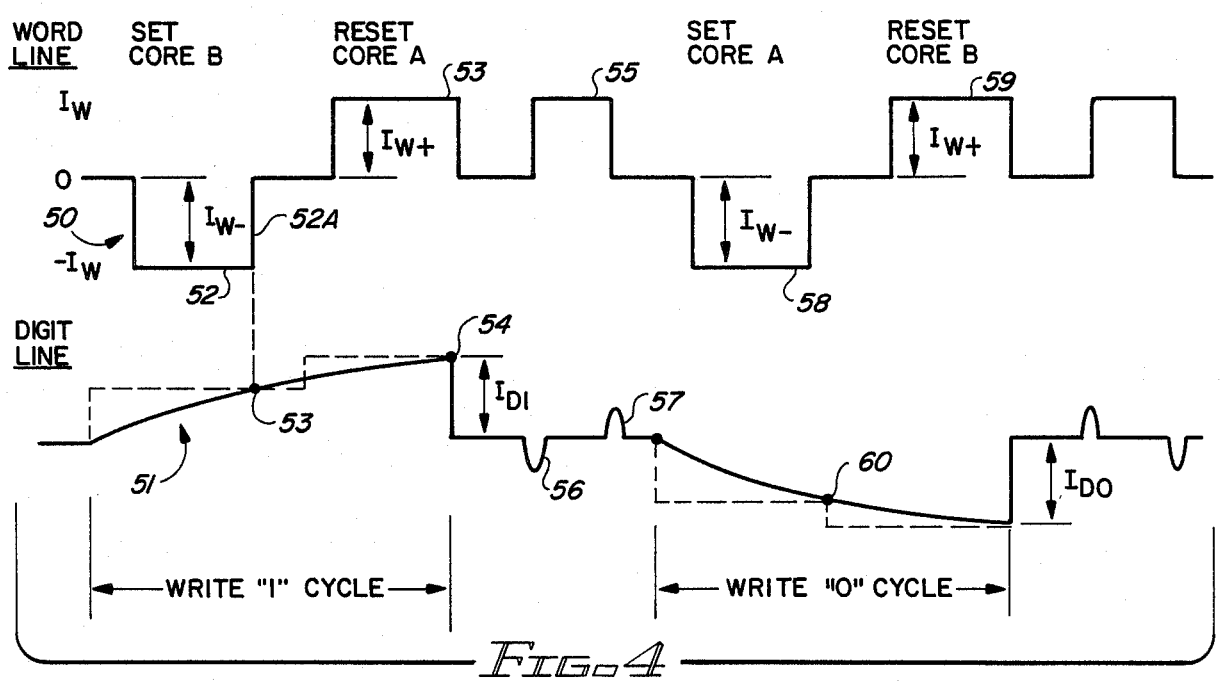
FIG. 4 is a timing diagram illustrating a different way of performing a soft write operation on the NDRO core memory of FIG. 1.

FIG. 4 illustrates this, wherein reference numeral 50 designates the word line current. The amplitudes $I_{W+}$ and $I_{W-}$ of each of the illustrated positive and negative word line pulses are equal for both "soft write" and "normal write" phases of each memory cycle. The digit current can be sloped, as indicated by waveform 51, or stepped as indicated by the dotted lines. During the negative word pulse 52, coincidence of that negative word current $I_{W-}$ with a relatively low value 53 of digit current results in a "soft write" operation that sets core B.

The slope of digit current 51 is such that by the time of the trailing edge 52A of word pulse 52, i.e., by the time of point 53 of digit line waveform 51, the amplitude of the digit current is only approximately 0.7 times its maximum value $I_{D1}$.

During the next positive word line current pulse 53, the amplitude of the digit line current has increased up to a sufficiently high value 54 to cause a "full current" resetting of core A to the opposite state of core B. Then, the leading edge of read pulse 55 results in the readout voltage pulse designated by reference numeral 56, and the trailing edge of read pulse 55 produces the opposite polarity sense voltage pulse 57 on the digit line conductor.

Similarly, during the next two word pulses 58 and 59, the digit line waveform 51 goes gradually negative, so that by the time point 60 is reached, its amplitude is about 0.7 times the most negative amplitude $I_{D0}$. The coincidence of the low amplitude portion of the digit current occurring before point 60 with the negative word line current $I_{W-}$ of pulse 58 results in a "soft write" setting of core A. The coincidence of the positive write current $I_{W+}$ of pulse 59 with the increased amplitude negative portion of digit line current 51 occurring after point 60 results in a "full current", rather than a "soft write" resetting of core B to the opposite state of core B.

It should be appreciated that there are yet other techniques than those described above for practicing the "soft write" technique of the present invention. For example, it is not necessary that both cores of each memory cell be written into with coincident currents. For example, in some instances, both core A and core B could be initially set to a particular initial state, i.e., they could be "cleared" by a large amplitude current passing through the word line.

In the circuit of FIG. 1, for example, a word line current of about 800 milliamperes could be utilized at the beginning of each memory cycle to "clear" both core A and core B to the same initial state. Then, a coincidence of a word current with a digit current could be provided on a first one of the two "cleared" cores to "soft write" the opposite state into the second core. The sum of the two coincident currents would be substantially less than 800 milliamperes, for example, 680 milliamperes, in order to "soft write" that opposite state into the second one.

There are other known NDRO core memory systems in which a single "reference core" is shared with an entire column of other individual cores, rather than including a separate "reference core" in each individual memory cell, as described herein. The soft write technique of the present invention can be applied to such NDRO core memory systems also.

While the invention has been described with reference to a particular embodiment thereof, those skilled in the art will be able to make various modifications to the described embodiment of the invention without departing from the true spirit and scope thereof. It is intended that all NDRO core memories that are equivalent to the described herein in that they perform substantially the same function in substantially the same way to obtain the same result are to be considered within the scope of the invention. For example, there can be more than two cores per memory bit. It has been common to utilize the technique shown in FIG. 1 to boost the sense voltages by using more than one pair of cores storing opposite states per memory bit.

We claim:

1. A method of increasing sense voltages of a first NDRO core memory cell including first and second switchable cores each having first and second stable states, the method comprising the steps of:
    (a) forcing a word line current and a digit line current to flow simultaneously in the same direction through the first core and in opposite directions through the second core to set the first core to its first stable state;
    (b) forcing a word line current and a digit line current to flow in opposite directions through the first core and in the same direction through the second core to set the second core to its second stable state, the sum of the amplitudes of the word line current and the digit line current in step (b) being substantially less than the amplitude of the sum of the amplitudes of the word line current and the digit line current in step (a), whereby a hysteresis loop of the second core is substantially smaller than a hysteresis loop of the first core; and
    (c) forcing a read current having an amplitude small enough to avoid changing the state of the second core to flow through the first and second cores, causing a substantially larger voltage to be induced across the second core than across the first core, and applying the difference between the voltages induced across the first and second core to an input of a sense amplifier.

2. The method of claim 1 including providing a word line extending through the first and second cores in the same direction, wherein step (a) includes forcing the word line current through that word line, and also providing a sense-digit conductor passing through the first and second cores in opposite directions, wherein step (a) includes forcing the digit line current to flow through that digit line.

3. The method of claim 2 wherein the word line and the sense-digit line pass in similar fashion through a plurality of additional NDRO memory cells, respectively, each of which is essentially identical to the first NDRO core memory cell.

4. The method of claim 1 further including the steps of repeating steps (a) and (b), in each case reversing the directions of the word line current and digit line current in order to write a state in the first NDRO memory cell which is opposite to the state written therein by performing steps (a) and (b).

5. The method of claim 1 wherein the amplitude of the word line current of step (a), the digit line current of step (a), and the digit line current of step (b) all have substantially equal amplitudes, and wherein the amplitude of the word line current of step (b) is substantially less than the amplitude of the word line current of step (a).

6. The method of claim 5 wherein the ratio between the word line current of step (b) and the word line current of step (a) is greater than approximately 0.5.

7. The method of claim 1 wherein the read current flows in the direction opposite to the direction in which the word line current flows in step (b).

8. The method of claim 1 wherein the hysteresis loop of the first core has a first slope at the first stable state and the hysteresis loop of the second core has a second slope at the second stable state, the first slope being substantially smaller than the second slope, the voltages induced across the first and second cores being approximately proportional to the first and second slopes, respectively.

9. A system for increasing sense voltages of a first NDRO core memory cell including switchable first and second cores each having first and second stable states, the system comprising:
    (a) means for forcing a word line current and a digit line current to flow simultaneously in the same direction through the first core and in opposite directions through the second core to set the first core to its first stable state;
    (b) means for forcing a word line current and a digit line current to flow in opposite directions through the first core and in the same direction through the second core to set the second core to its second stable state, the sum of the amplitudes of the word line current and the digit line current setting the second core to its second stable state being substantially less than the sum of the amplitudes of the word line current and the digit line current setting the first core to its first stable state, whereby a hysteresis loop of the second core in its second stable state is substantially smaller than a hysteresis loop of the first core in its first stable state; and (c) means for forcing a read current having an amplitude small enough to avoid changing the state of the second core through to flow the first and second cores, causing a substantially larger voltage to be induced across the second core than across the first core, and applying the difference between the voltages induced across the first and second cores to an input of a sense amplifier.

10. An NDRO core memory system comprising in combination:
   (a) a plurality of memory cells, each including switchable first and second cores each having first and second stable states;
   (b) a word line conductor strung in a first direction through the first and second cores of each of the memory cells;
   (c) word line driver means for selectively producing a first word current flowing in the word line conductor through the first and second cores in the first direction and a second word current flowing in the word line conductor in a second direction opposite to the first direction through the first and second cores;
   (d) a sense-digit line conductor strung through the first and second cores of one of the memory cells so that a digit current flowing in the sense-digit line in the first direction through the first core of that memory cell flows in the second direction through the second core in that memory cell;
   (e) digit driver means for producing first and second digit currents in the sense-digit line conductor flowing in the first and second directions, respectively, through the first core;
   (f) sense amplifier means for sensing the difference between sense voltages induced across the first and second cores by a read current in the word line; and
   (g) means in the word line driver means for causing the second word current to be substantially smaller than the first word current so that in every memory write cycle, the one of the first and second cores that is written into a stable state by means of the second word line current has a first hysteresis curve that is substantially smaller than a second hysteresis curve of the other of the first and second cores.

11. The NDRO core memory of claim 10 wherein the first word line current, the first digit current, the second digit current, and the read current all have amplitudes of about 400 milliamperes, and the second word line current has an amplitude of about 300 milliamperes.

12. An NDRO core memory comprising in combination:
   (a) an NDRO memory cell including
      i. a first core set to a first stable state and having a first hysteresis curve with a first slope at a point corresponding to the first stable state,
      ii. a second core set to a second state and having a second hysteresis curve with a second slope at a point corresponding to the second stable state, the first slope being substantially different than the second slope;
   (b) means for producing a read current flowing through the first and second cores to excite the first and second cores and thereby produce first and second sense voltages across the first and second cores, respectively, the first and second sense voltages being approximately proportional to the first and second slopes, respectively; and
   (c) sense amplifier means for sensing and amplifying the difference between the first and second sense voltages.

13. The NDRO core memory of claim 12 wherein the first and second cores are ferrite cores having a diameter of about 18 mils.

14. The NDRO core memory of claim 12 including a word line conductor strung in a first direction through the first and second cores of the memory cell.

15. The NDRO core memory of claim 14 including word line driver means for selectively producing a first word current flowing in the word line conductor through the first and second cores in a first direction and a second word current flowing in the word line conductor in a second direction opposite to the first direction through the first and second cores.

16. The NDRO core memory of claim 14 including a sense-digit line conductor strung through the first and second cores of the memory cell so that a digit current flowing in the sense-digit line in the first direction through the first core flows in the second direction through the second core.

17. The NDRO core memory of claim 16 including digit driver means for producing first and second digit currents in the sense-digit line conductor flowing in the first and directions, respectively through the first core.

18. A method of operating an NDRO core memory comprising the steps of:
   (a) providing a first switchable core and a second switchable core;
   (b) setting the first core to a first stable state so that the first core has a first hysteresis curve with a first slope at the first stable state;
   (c) setting the second core to a second stable state so that the second core has a second hysteresis curve with a second slope at the second stable state, the first slope being substantially different than the second slope;
   (d) producing a read current through the first and second cores to excite the first and second cores and thereby produce first and second sense voltages across the first and second cores; and
   (e) sensing and amplifying the difference between the first and second sense voltages.

* * * * *